(12) United States Patent
Wu et al.

(10) Patent No.: US 9,980,368 B2
(45) Date of Patent: May 22, 2018

(54) DETACHABLE SHIELDING DEVICE

(71) Applicant: FOXCONN INTERCONNECT TECHNOLOGY LIMITED, Grand Cayman (KY)

(72) Inventors: Xun Wu, Kunshan (CN); Guo-Xiang Niu, Kunshan (CN)

(73) Assignee: FOXCOMM INTERCONNECT TECHNOLOGY LIMITED, Grand Cayman (KY)

( * ) Notice: Subject to any disclaimer, the term of this patent is extended or adjusted under 35 U.S.C. 154(b) by 2 days.

(21) Appl. No.: 15/240,744

(22) Filed: Aug. 18, 2016

(65) Prior Publication Data
US 2017/0055340 A1  Feb. 23, 2017

(30) Foreign Application Priority Data

Aug. 18, 2015 (CN) ............ 2015 2 0622612 U
Aug. 18, 2015 (CN) ............ 2015 2 0622720 U (51) Int. Cl.
*H05K 9/00* (2006.01)
*H05K 1/02* (2006.01)

(52) U.S. Cl.
CPC ......... *H05K 1/0216* (2013.01); *H05K 9/0032* (2013.01); *H05K 2201/10371* (2013.01)

(58) Field of Classification Search
CPC .. H05K 1/0216; H05K 9/0022; H05K 9/0024; H05K 9/0026; H05K 9/0028; H05K 9/0032; H05K 9/0052; H05K 2201/10371; H05K 2201/10393
See application file for complete search history.

(56) References Cited

U.S. PATENT DOCUMENTS

| | | | | |
|---|---|---|---|---|
| 5,014,160 A | * | 5/1991 | McCoy, Jr. ............ | H05K 3/308 174/363 |
| 5,354,951 A | * | 10/1994 | Lange, Sr. ........... | H05K 9/0032 174/372 |
| 5,400,949 A | | 3/1995 | Hirvonen et al. | |
| 5,742,488 A | | 4/1998 | Lonka et al. | |
| 5,895,884 A | * | 4/1999 | Davidson ............. | H05K 9/0032 174/366 |
| 6,649,827 B2 | * | 11/2003 | West .................... | H05K 9/0032 174/377 |
| 6,949,706 B2 | * | 9/2005 | West .................... | H05K 9/0032 174/384 |

(Continued)

FOREIGN PATENT DOCUMENTS

CN       2514579       10/2002
CN     201355895 Y    12/2009

(Continued)

*Primary Examiner* — Hoa C Nguyen
(74) *Attorney, Agent, or Firm* — Wei Te Chung; Ming Chieh Chang (57) ABSTRACT

A shielding device mounted upon a printed circuit board comprises a shielding shell including a top wall, a sidewall and at least a clamping means extending downwardly therefrom respectively, which surrounds a receiving cavity defined by the shielding shell; at least a bracket removably clamped within said clamping means and fixed upon said printed circuit board; wherein the clamping means includes a first clamping part and a second clamping part respectively abutting elastically against two opposite sides of said bracket.

20 Claims, 13 Drawing Sheets

(56) References Cited

U.S. PATENT DOCUMENTS

| | | | | |
|---|---|---|---|---|
| 7,876,579 B1* | 1/2011 | Tsau | ................... | H05K 9/0032 361/816 |
| 2007/0210082 A1* | 9/2007 | English | ............... | H05K 9/0032 220/4.21 |
| 2009/0242264 A1* | 10/2009 | Lei | ...................... | H05K 9/0032 174/382 |

FOREIGN PATENT DOCUMENTS

| | | |
|---|---|---|
| KR | 20100115069 | 10/2010 |
| TW | M299447 | 10/2006 |

\* cited by examiner

DETACHABLE SHIELDING DEVICE

BACKGROUND OF THE INVENTION

1. Field of the Invention

The present invention relates to a shielding device, and particularly to a detachable shielding device with a shielding shell and a bracket removably assembled to the shielding shell and fixed on a printed circuit board.

2. Description of Related Art

The Taiwan Utility Patent No. M299447 discloses a substantially rectangular shielding device consisting of a lower shield frame and an upper shield cover arranged on the frame, wherein the frame forms a receiving cavity to receive the electric devices on a printed circuit board, and is mounted onto the printed circuit board and is assembled with the cover furtherly. The frame is molded integrally with a sidewall and a separate wall separating the electric devices. The cover forms a plurality of tabs to attach to the outside of the frame and is removably locked with the frame via a concave-convex structure. Notably, one potential problem is regarding the assembling reliability between the frame and the cover. Also, the structure of the frame is complicated which results in a high cost.

Hence, a detachable shielding device including an improved structure is necessary.

SUMMARY OF THE INVENTION

Accordingly, an object of the present invention is to provide a shielding device overcoming the aforementioned shortcomings.

To achieve the above object, a shielding device mounted upon a printed circuit board is provided, comprising a shielding shell including a top wall, a sidewall and at least a clamping means extending downwardly therefrom respectively, which surrounds a receiving cavity defined by the shielding shell; at least a bracket removably clamped within said clamping means and fixed upon said printed circuit board; wherein the clamping means includes a first clamping part and a second clamping part respectively abutting elastically against two opposite sides of said bracket.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
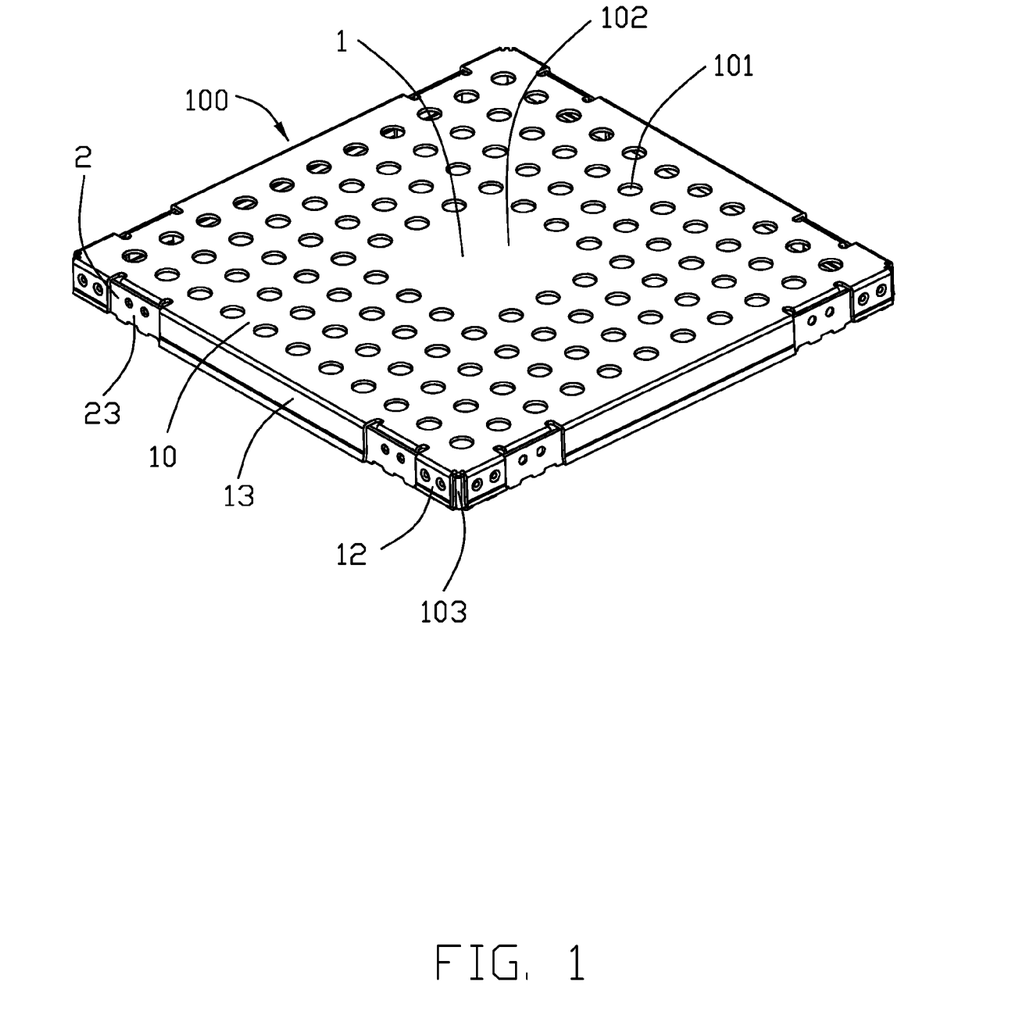
FIG. 1 is a perspective view of a shielding device, according to a first embodiment of the invention.
Figure 3:
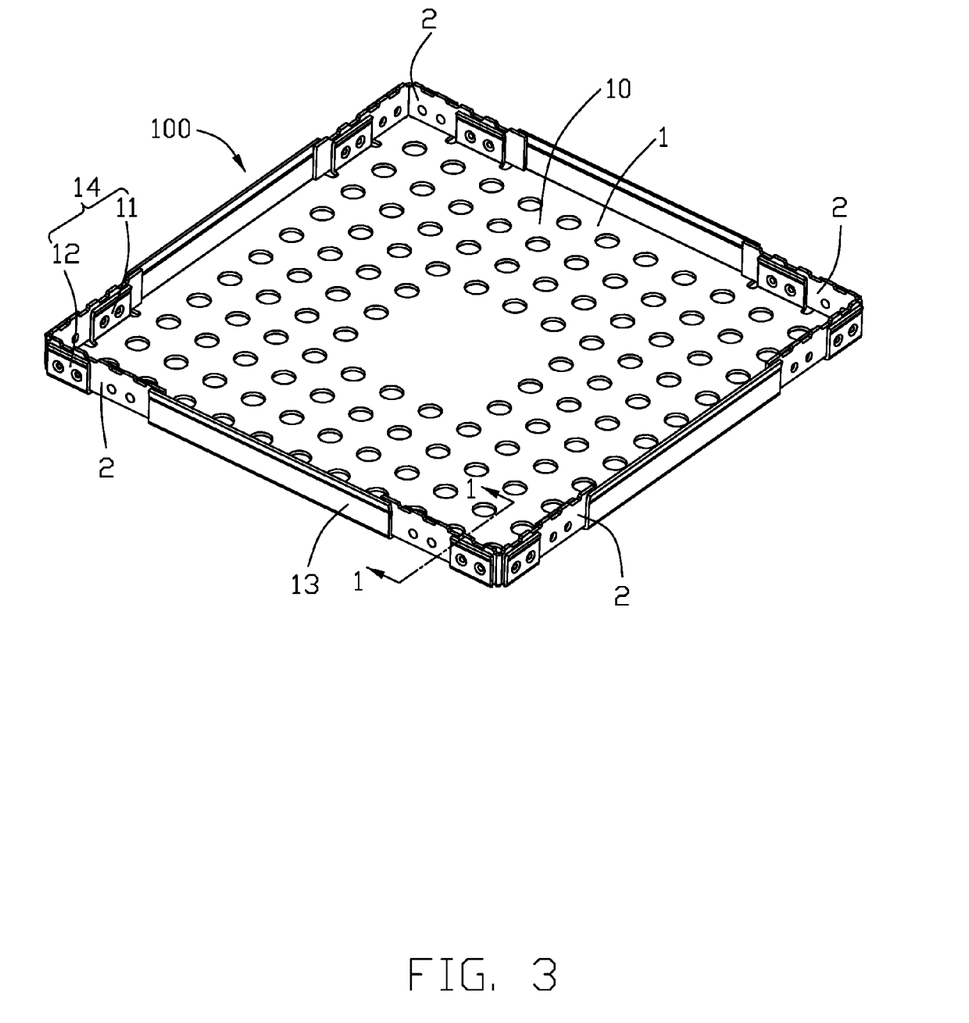
FIG. 3 is another perspective view of the shielding device in FIG. 1.
Figure 6:
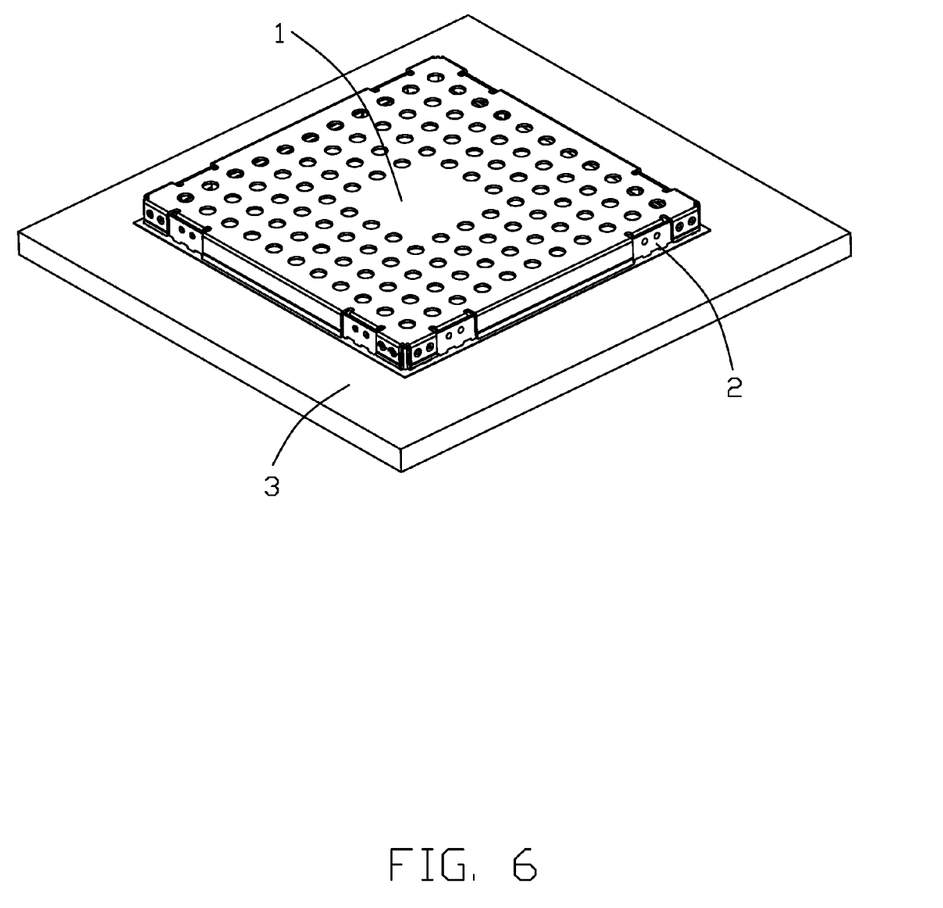
FIG. 6 is a perspective view of the shielding device mounted upon a printed circuit board in FIG. 1.
Figure 7:
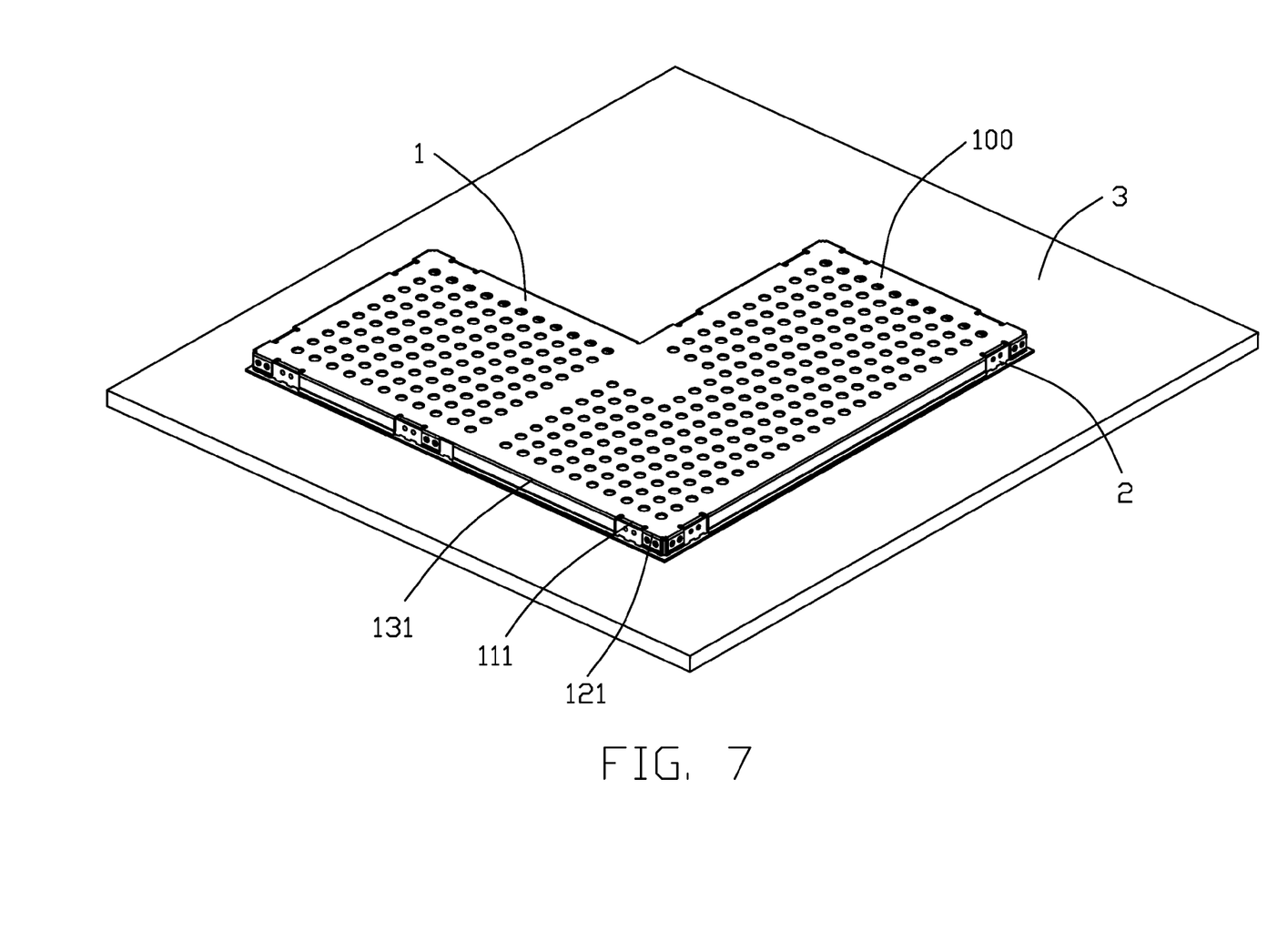
FIG. 7 is a perspective view of a shielding device mounted upon a printed circuit board, according to a second embodiment of the invention.
Figure 8:
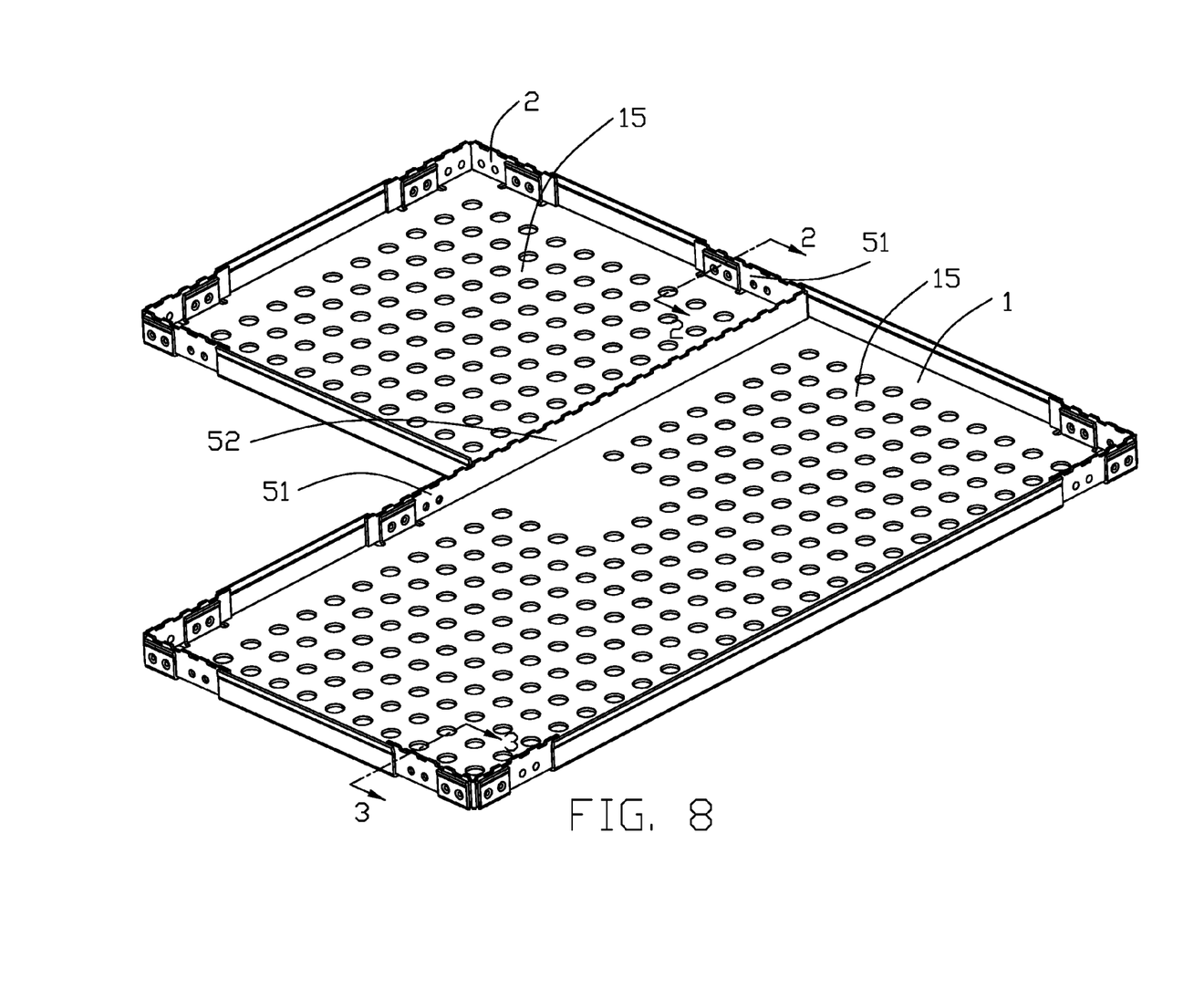
FIG. 8 is a perspective view of the shielding device in FIG. 7.
Figure 9:
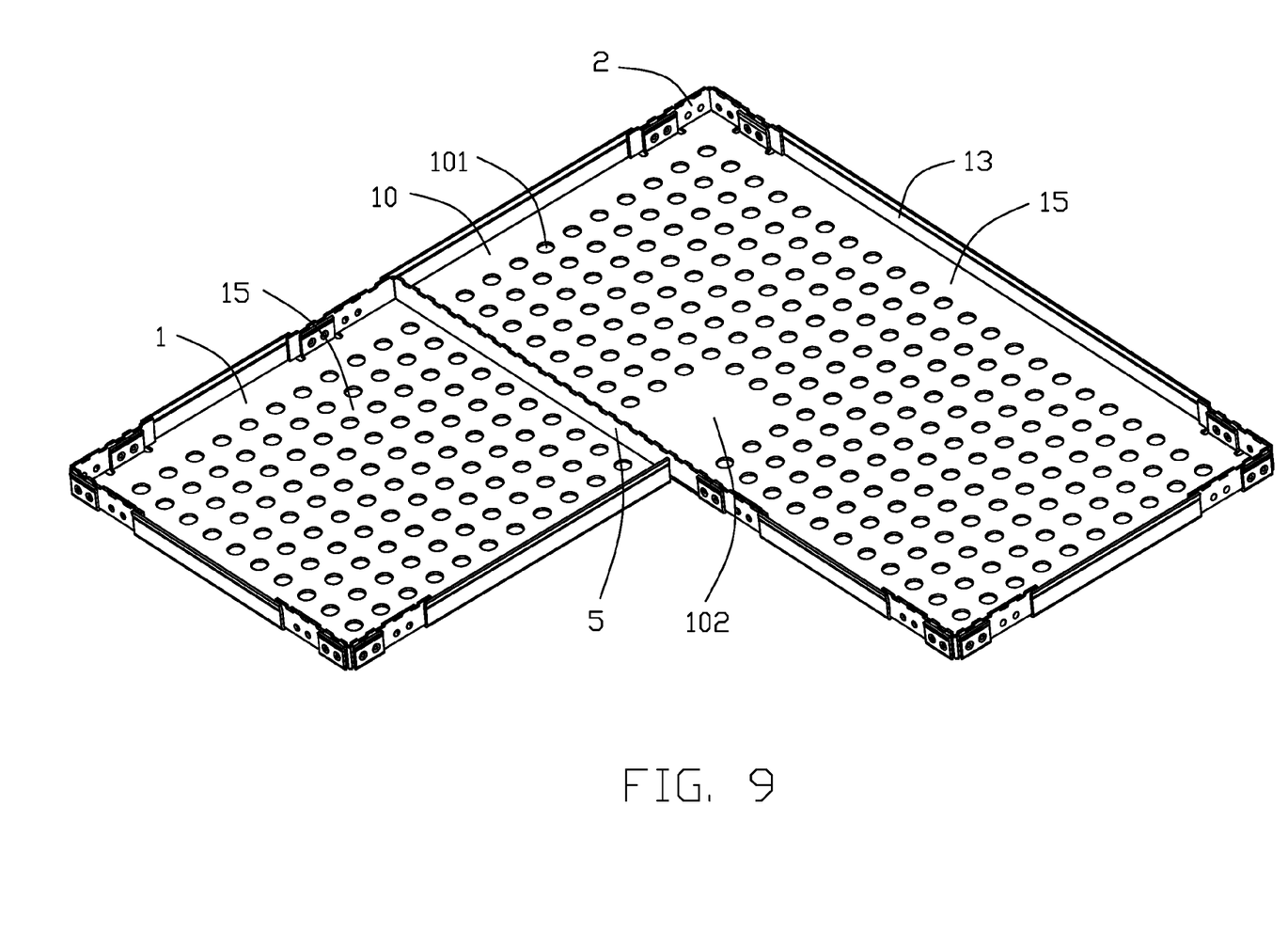
FIG. 9 is another view of the shielding device in FIG. 8.
Figure 10:
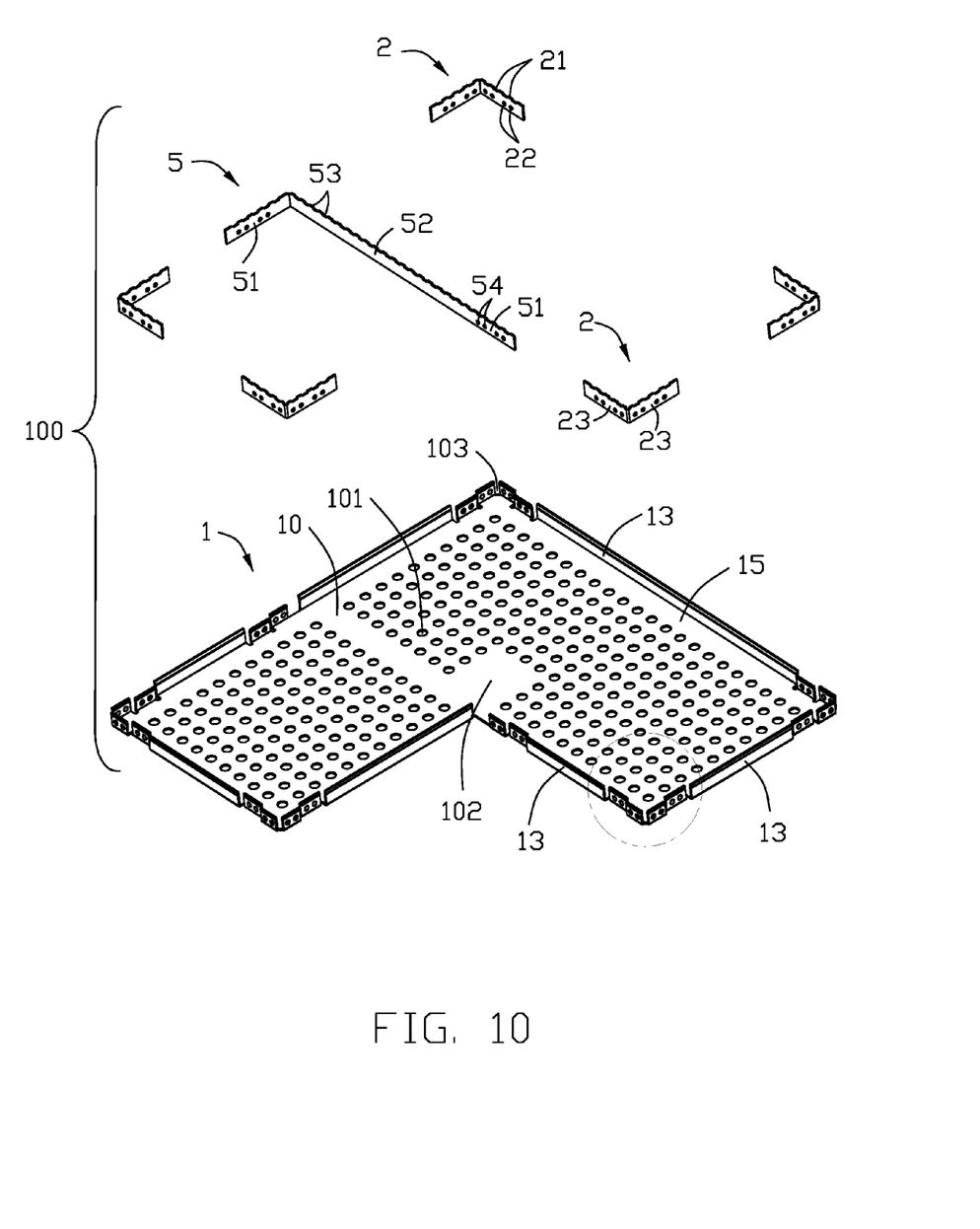
FIG. 10 is an exploded view of the shielding device in FIG. 9.
Figure 11:
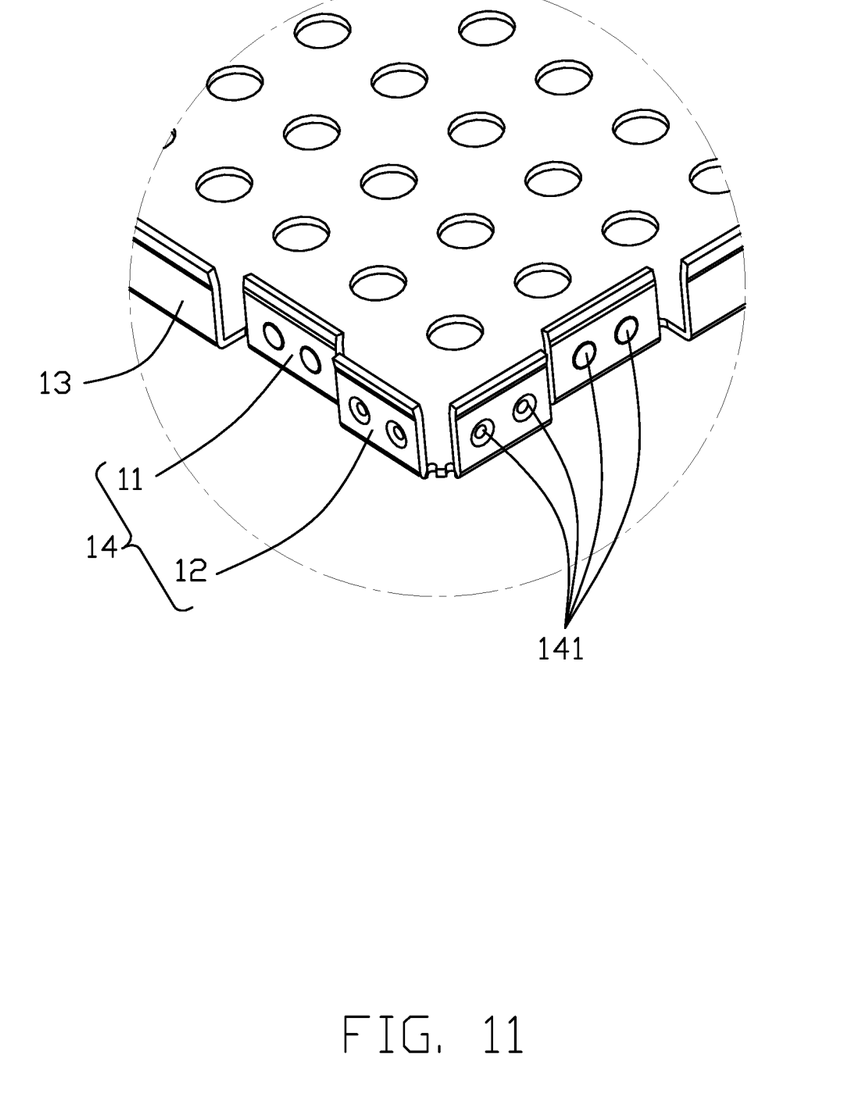
FIG. 11 is a partial enlarged view of the shielding device in FIG. 10.
Figure 12:
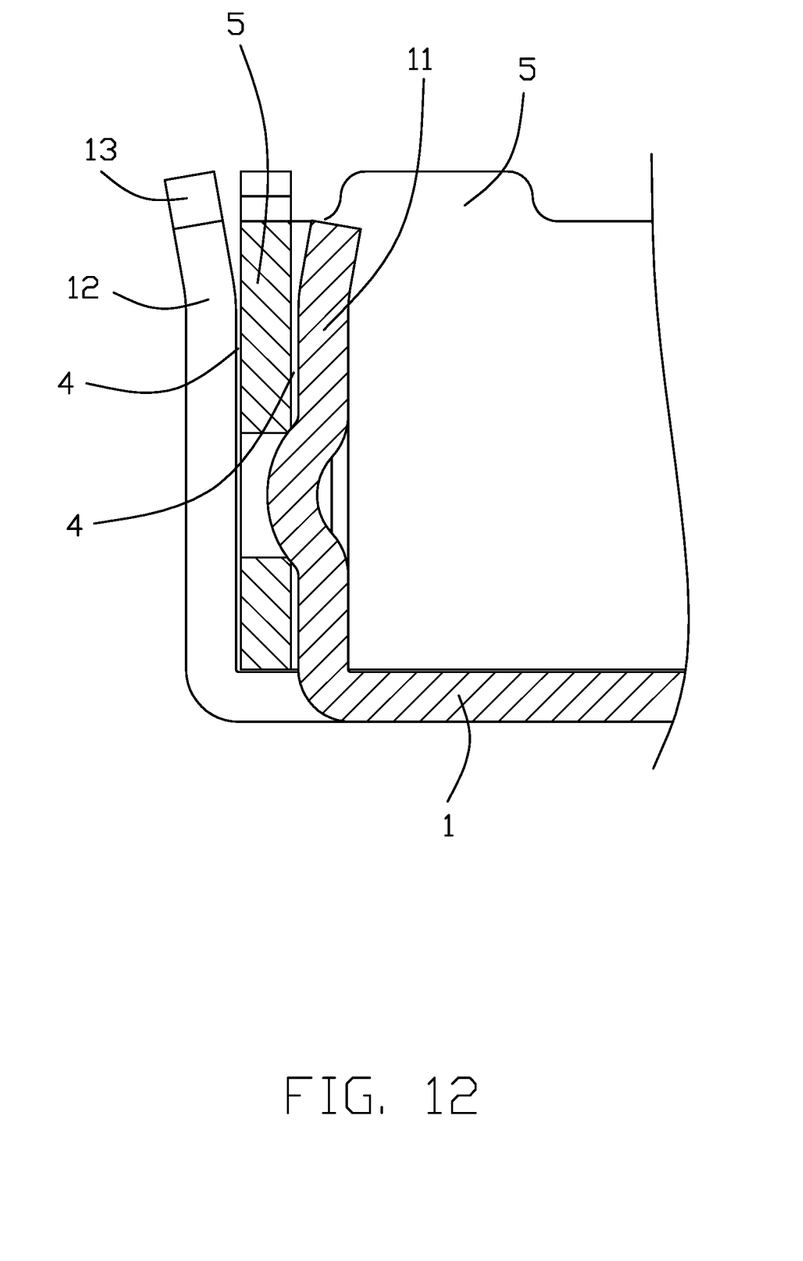
FIG. 12 is a sectional view of the shielding device along line 2-2 in FIG. 8.
Figure 13:
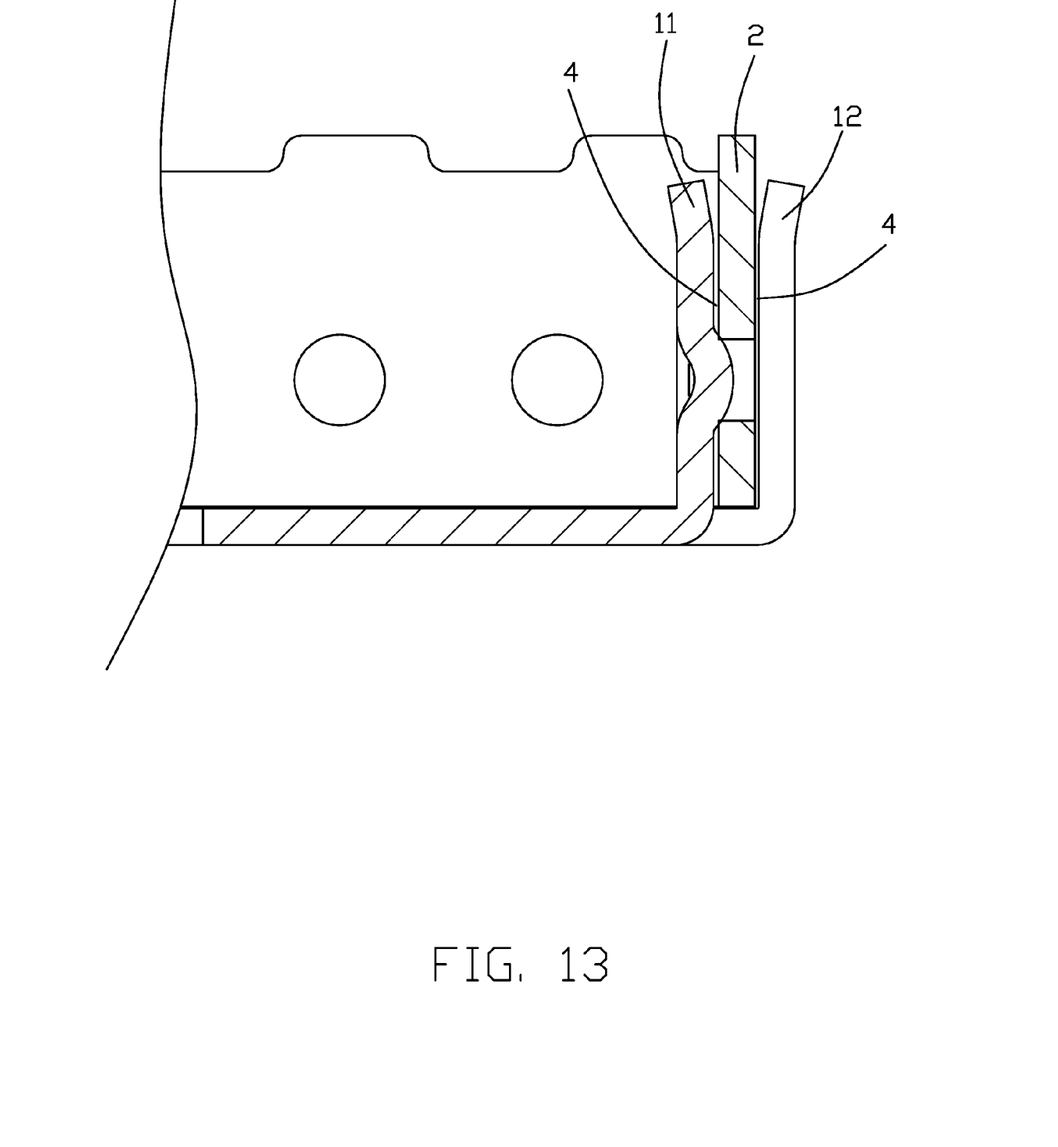
FIG. 13 is a sectional view of the shielding device along line 3-3 in FIG. 8.

Referring to FIGS. 1, 3 and 6, a first embodiment of the present invention is illustrated. A shielding device 100 made in accordance with the present invention for shielding the electromagnetic wave includes a metallic shielding shell 1 mounted on a printed circuit board 3 and at least a metallic bracket 2 removably assembled to the shielding shell 1 for supporting upwardly. Notably, the bracket 2 can be soldered onto the printed circuit board 3 or not dependent on specific requests from the customers. When the bracket 2 is soldered, it can be made of or plated with welding material, such as copper alloy, and when not, the bracket 2 can be made steel or aluminum. Optimally, the rigidity of the bracket 2 is larger than that of the shielding shell 1.

The shielding shell 1 includes a top wall 10 and at least a clamping means 14 and at least a sidewall 13 both extending downwardly vertically from the side edge of the top wall 10. The top wall 10 and the clamping means 14 and the sidewall 13 commonly surround a receiving cavity defined by the shielding shell 1 for receiving an electric device (not shown). The top wall 10 defines a plurality of through holes 101 for elimination of heat when the electric device is working or during a soldering process. The shielding shell 1 also defines a centroidal zone 101 where there is no through hole 101 disposed so as to help a suction machine (not shown) grab it easily during an automatically soldering process.

In order to describe the present invention more simply, an up-to-down direction and a medial-to-lateral direction are defined. Wherein the shielding shell 1 with the bracket 2 preassembled into is mounted downwardly to the printed circuit board 3 or the shielding shell 1 is mounted downwardly to the bracket 2 after the bracket 2 is welded onto the printed circuit board 3 and the shielding shell 1 is upwardly separated from the bracket 2 when an outward force is provided on the shielding shell 1, in the up-to-down direction. Wherein the clamping means 14, alternatively arranged with the sidewall 13 around the top wall 10, includes a first clamping part 11 and a second clamping part 12 spaced from each other along the medial-to-lateral direction and around the extending direction of the side edge of the top wall 10, which simplifying significantly the manufacturing process. Wherein the first clamping part 11 and the second clamping part 12/the sidewall 13 elastically abut against an inner side and an outer side of the bracket 2 in two opposite orientations respectively, that is, the bracket 2 is sandwiched between the first clamping part 11 and the second clamping part 12/the sidewall 13.

Figure 2:
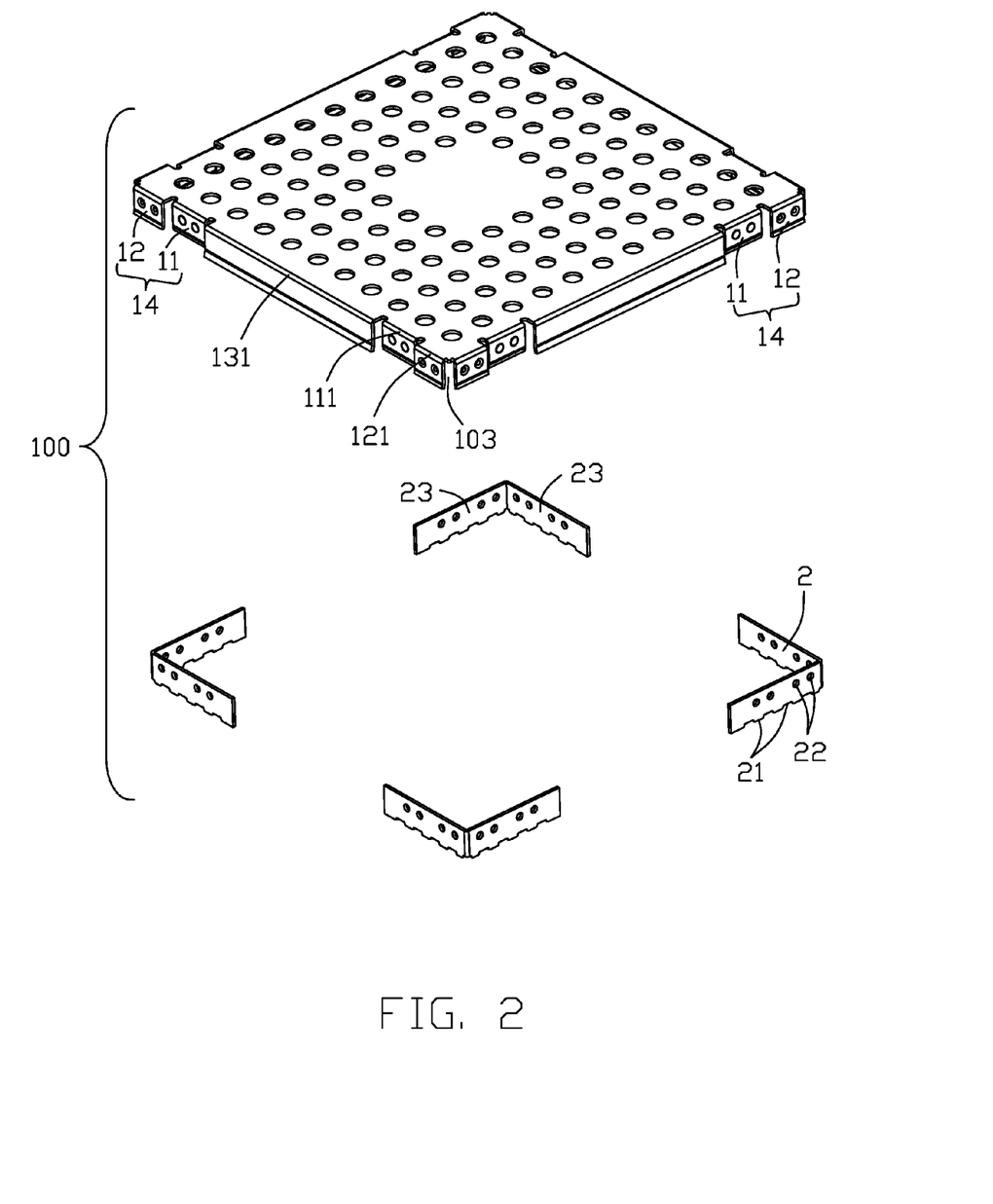
FIG. 2 is an exploded view of the shielding device in FIG. 1.
Figure 4:
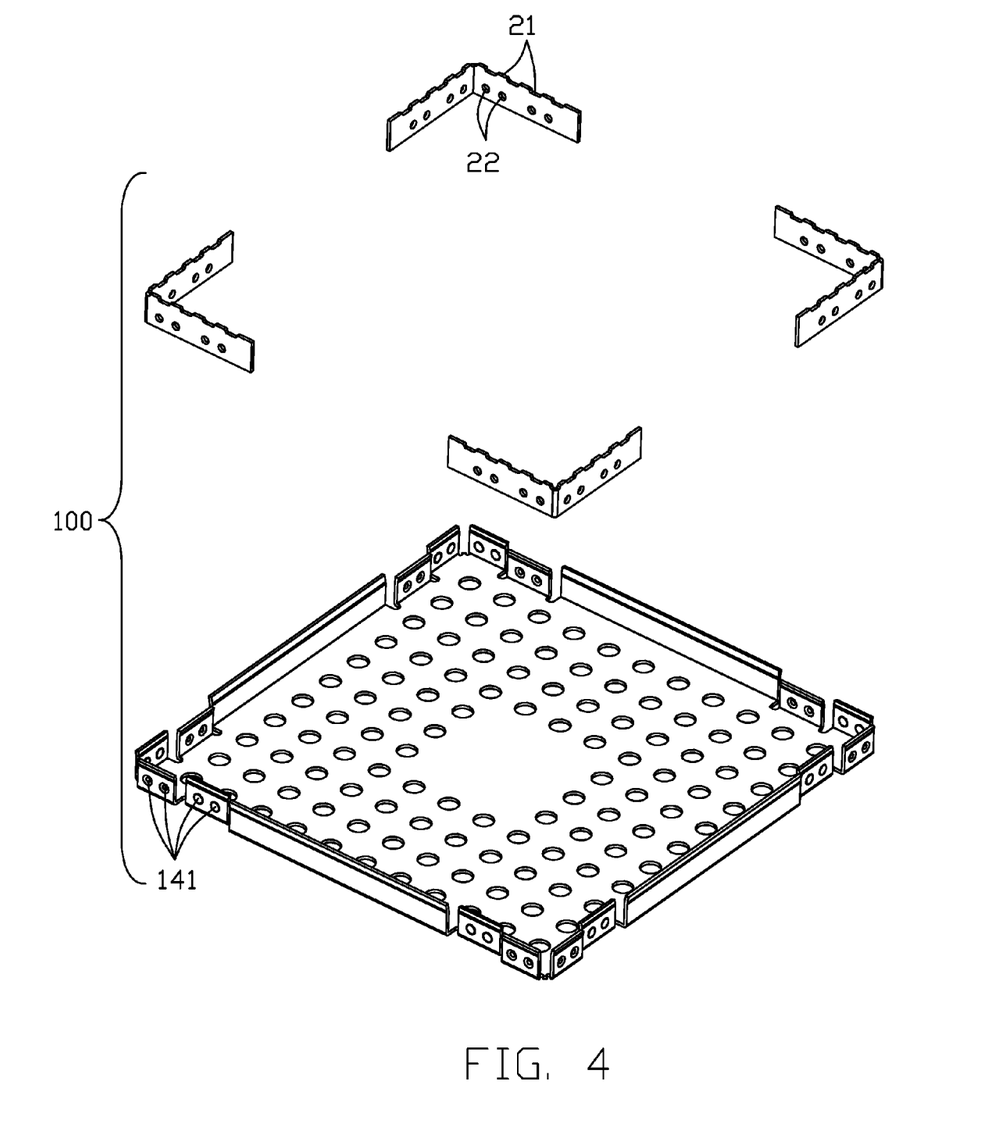
FIG. 4 is an exploded view of the shielding device in FIG. 3.

Referring to FIGS. 2 and 4, in this embodiment according to the present invention, the shielding shell is formed by punching and stamping and bending a plate (not shown), meanwhile a plurality of cutouts formed between the first clamping part 11 and the second clamping part 12 and the sidewall 13, which is convenient for a bend molding of them but also result in a formation of a plurality of seams therebetween when the bending process is finished. The plate defines a first fold line 111 where the first clamping part 11 bended downwardly, a second fold line 121 where the second clamping part 12 bended downwardly, and a third fold line 131 where the sidewall 13 bended downwardly. The three fold lines 111, 121, 131 are respectively adjacent to the cutouts. The second fold line 131 and the third fold line 121 are substantially aligned to each other around an extending direction of the side edge of the top wall 10, and both deflected outward away from the first fold line 111 aiming to providing a clamping space between the second clamping part 12/the sidewall 13 and the first clamping part 11 for receiving the bracket 2. It will be appreciated that in other embodiment the first clamping part 11 and the second clamping part 12/the sidewall 13 can also align to each other in the medial-to-lateral direction to form said clamping space, and be stagger partly around the extending direction of the side edge of the top wall 10. And in other embodiment the first clamping part 11 and the second clamping part 12/the sidewall 13 can also align to each other around the extending direction of the side edge of the top wall 10 to provide the clamping space only when they are deforming elastically, which should be noted, too.

Figure 5:
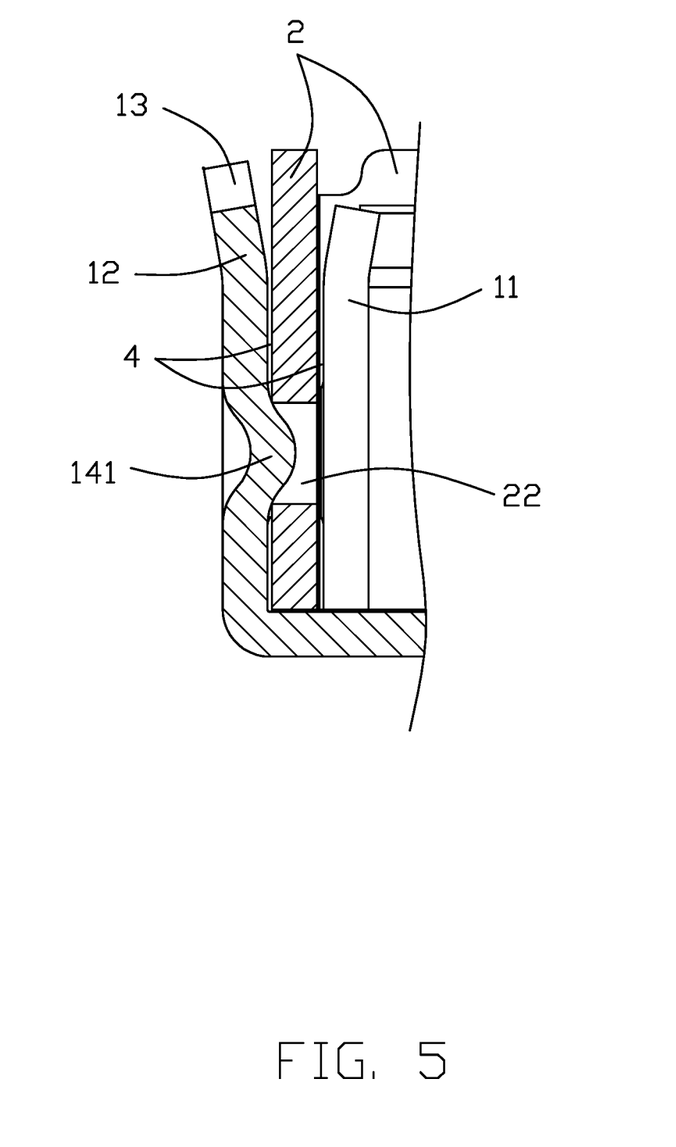
FIG. 5 is a partial sectional view of the shielding device along line 1-1 in FIG. 3.

In this embodiment, the sidewall 13 is between two said clamping means 14, and two said first clamping parts 11 are respectively adjacent to two opposite ends of the sidewall 13. The first clamping part 11 attaches to the inner side of the bracket 2 to provide an outward holding force thereon while the second clamping part 12 and the sidewall 13 attach to the outer side of the bracket 2 both to provide an inward holding force thereon. That is, the sidewall 13 contains the same clamping action to the bracket 2 as the second clamping part 12. However, the main body of the bracket 2 contacts to the first clamping part 11 or the second clamping part 12, but it is two ends of the bracket 2 oppositely extending from the main body that abuts against the sidewall 13. Moreover, the clamping means 14 retains the bracket 2 by a locking action between a dome 141 and a corresponding round hole 22 respectively defined on the clamping means 14 or the bracket 2. In this embodiment, the bracket 2 defines the round hole 22 going through the main body thereof, while the clamping means 14 defines the dome 141 protruding inward from the second clamping part 12 and protruding outward from the first clamping part 11. Further referring to FIGS. 3 and 5, a gap 4 is defined between the first clamping part 11 and the bracket 2 or the second clamping part 12 and the bracket 2 to provide an easy assembling or disassembling process under the condition of a sufficient fixation.

Referring to FIGS. 2 to 4, the bracket 2 includes two interference pieces 23 and their included angle which is a right angle in this embodiment, so that the bracket 2 is appropriately assembled to the corner of the rectangular shielding shell 1. Correspondingly, the clamping means 14 is also constructed into a right-anger shape disposed at the corner of the shielding shell 1 and clamps said two interference pieces 23 respectively, each interference piece 23 being clamped between at least one first clamping part 11 and at least one second clamping part 12. The aforementioned structure is conducive to eliminating the seams 103 located at the corners of the shielding shell 1 to further improve the anti-EMI (Electro-Magnetic Interference) effect, and fastening the clamping means 14 to prevent it from expanding and collapsing which results in a separation of the shielding shell 1 and the bracket 2 and finally a loss of an anti-EMI effect. In this embodiment, four said clamping means 14 and four said brackets 2 are included and located at four corners of the rectangular shielding shell 1, respectively. Notably, four said sidewalls 13 are provided so as to connect with both the brackets 2 and the clamping means 14 in an end-to-end way so as to encircle or shroud the top wall 10 for a good anti-EMI effect. Furtherly, each bracket 2 is a strip-shape and includes a soldering face 21 at the bottom thereof and the soldering face 21 is of a concave-convex structure in the up-to-down direction for receiving more solder (not shown).

Referring to FIGS. 3 to 4, the first clamping part 11 bends inwardly from a bottom edge thereof, while the second clamping part 12 and the sidewall 13 bend outwardly from the bottom edges thereof, on the one hand, which forms a plurality of guiding faces to lead the bracket 2 within smoothly, and on the other hand, which expands a space between the clamping means 14/the sidewall 13 and the bracket 2 to receive extra solder so as to prevent them from being soldered together during a soldering process.

Referring to FIGS. 1 to 2, when assembling the shielding shell 1 and the bracket 2, initially the bracket 2 is pressed into the clamping space of the clamping means 14 under a guidance of the guiding faces formed on the clamping means 14 and the sidewall 13, with that the first clamping part 11 expands inwards and snugly abuts against the inner face of the bracket 2 while the second clamping part 12 and the sidewall 13 expands outwards and snugly abuts against the outer face of the bracket 2 under a stress exerted by the bracket 2. Afterwards, the dome 141 smoothly slips into and positions in the round hole 22 with the help of an arc's leading. And then the suction device grabs the centroidal zone 102 of the top wall 10 and assembles the shielding shell 1 onto the printed circuit board 3, with an automatically soldering process when the soldering face 21 of the bracket 2 is positioned and fixed on a certain location of the printed circuit board 3 via a reflow soldering technology. Finally the shielding device 100 is fixed on the printed circuit board 3. When disassembling the shielding shell 1 away from the printed circuit board 3, exert an outward force on the shielding shell 1 so that the first clamping part 11 and the second clamping part 12 get stagger gradually in an up-to-down direction with the dome 141 getting out of the round hole 22 smoothly and abutting against two opposite faces of the bracket 2 in the medial-to-lateral direction with the help of the arc's leading as well. Meanwhile the first clamping part 11 expands inwards and the second clamping part 12 expands outwards under the stress. And keep the outward force until the shielding shell 1 is separated from the bracket 2 completely when the clamping means 14 gets back into shape.

In this embodiment, it is available that the shielding device 100 equips with a plurality of clamping means 14 instead of an integral side wall and a plurality of brackets 2 instead of an integral frame corresponding to the clamping means 14 which increases a flexibility of designing and decreases a manufacturing cost due to less material owing to said partially disposed brackets 2 around the top wall 10 and less operating steps owing to simple structure of the bracket 2 and the shielding shell 1. It should be noted that the amount, the shape or the location of the brackets 2 can all be configured according to the specific needs from the customers in a more free access, which improves a designing flexibility of the shielding device 100. The detachable shielding device 100 can meet the need of opening the shielding shell 1 and checking the electric device when a testing goes wrong or the electric device is damaged, and capping the bracket 2 with the shielding shell 1 when finishing checking and repairing. The clamping means 14 is molded integrally with the top wall 10 but not the bracket 2, which contributes to simplifying a structure of the bracket 2 such as a strip-shape or a slice-shape which is conducive to a less occupied space on the printed circuit board 3 and further stretching the useful life of the bracket 2 so as to avoid a complicated process of dismounting the soldered bracket 2 from the printed circuit board 3 when the bracket 2 is damaged. Notably, in other embodiment, the clamping means 14 can be disposed all over the shielding shell 1 via a soldering technology, in a locking way or by other manners, and the shielding shell 1 can also be mounted to the bracket 2 after the bracket 2 is soldered on the printed circuit board 3.

Referring to FIGS. 7 to 13, a second embodiment of the present invention is illustrated. A shielding device 100 made in accordance with the present invention for shielding the electromagnetic wave includes a shielding shell 1 with at least a clamping means 14 and at least a bracket 2 clamped within the clamping means 14 and a top wall 10 and a sidewall 13, and a receiving cavity 15 surrounded thereby. It should be noted that the shielding device 100 of the second embodiment is constructed the same with the first embodiment other than that the shielding device 100 of the second embodiment is L-shaped with a L-shaped receiving cavity 15 different from the rectangular shape of the first embodiment, and the bracket 2 of the second embodiment additionally works as a partitioning bracket 5 with a partitioning portion 52 and a retaining portion 51 extending therefrom to spatially partition the receiving cavity 15 into two parts for respectively receiving and shielding the electric devices, wherein the retaining portion 51 is clamped by the clamping means 14 while the partitioning portion 52 is located in the middle of the receiving cavity 15 for a partitioning. In this embodiment, the retaining portion 51 defines at least a round hole 54 to lock with the corresponding dome 141 defined by the clamping means 14 and a soldering face 53 soldered onto the printed circuit board 3, while the partitioning portion 52 defines neither of them. Said shielding shell 1 presents as an L-shape, and defines a substantially square section connecting to a substantially rectangular section, said partitioning bracket 5 located between the square section and the rectangular section to separate said receiving cavity 15 into an enclosed square cavity and an enclosed rectangular cavity. Said partitioning bracket 5 presents as an L-shape and includes a transverse portion clamped by the clamping means 14 extending from said square section, and a longitudinal portion clamped by the clamping means 14 extending from said rectangular section. It should be understood that the partitioning bracket 5 can be constructed as other shapes including Y-shape, arc-shape or more complicated shape combined with aforementioned shapes, and the retaining portion 51 can be located at anywhere of the shielding shell 1 as long as the location is where the corresponding clamping means 14 is disposed, and it's certain that the amount or the shape of both the retaining portion 51 and the partitioning portion 52 can be also various following a variety of needs from the customers, and the partitioning bracket 5 also can be not soldered onto the printed circuit board 3 even though it has formed the soldering face 53.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A shielding device mounted upon a printed circuit board comprising:
   a shielding shell including a top wall, and a sidewall and at least a clamping means extending downwardly therefrom respectively, which surrounds a receiving cavity defined by the shielding shell;
   at least a bracket removably clamped within said clamping means and fixed upon said printed circuit board;
   wherein the clamping means includes a first clamping part and a second clamping part respectively abutting elastically against two opposite sides of said bracket.

2. The shielding device as claimed in claim 1, wherein the bracket is strip-shaped and includes two interference pieces and a certain included angle between them.

3. The shielding device as claimed in claim 2, wherein the shielding shell includes a plurality of said brackets, respectively located at the corners of the shielding shell.

4. The shielding device as claimed in claim 1, wherein said first clamping part and said second clamping part are spaced from each other along a medial-to-lateral direction and around an extending direction of a side edge of the top wall.

5. The shielding device as claimed in claim 4, wherein two said first clamping parts are respectively adjacent to two opposite ends of the sidewall.

6. The shielding device as claimed in claim 4, wherein the shielding shell defines a first fold line where the first clamping part bended downwardly, a second fold line where the second clamping part bended downwardly, and a third fold line where the sidewall bended downwardly, wherein the second fold line and the third fold line are substantially aligned to each other around the extending direction of the side edge of the top wall, while the first fold line deflected inward away from the second and third fold lines.

7. The shielding device as claimed in claim 1, wherein the shielding shell includes a plurality of said clamping means and a plurality of said sidewalls, said sidewalls alternatively arranged with said clamping means around an extending direction of the side edge of the top wall, each sidewall adjacent to said clamping means in an end-to-end way, said bracket abutting elastically against the sidewalls as well.

8. The shielding device as claimed in claim 1, wherein a gap is defined both between the first clamping part and the bracket, and between the second clamping part and the bracket.

9. The shielding device as claimed in claim 1, wherein the first clamping part bends inwardly from a bottom edge thereof, while the second clamping part bends outwardly from the bottom edges thereof in order to form a plurality of guiding faces.

10. The shielding device as claimed in claim 1, wherein said bracket includes a partitioning bracket separating said receiving cavity into two segments.

11. The shielding device as claimed in claim 10, wherein said shielding shell presents as an L-shape, and defines a substantially square section connecting to a substantially rectangular section, said partitioning bracket locates between the square section and the rectangular section to separate said receiving cavity into an enclosed square cavity and an enclosed rectangular cavity.

12. The shielding device as claimed in claim 11, wherein the partitioning bracket presents as an L-shape and includes a transverse portion clamped by the clamping means extending from said square section, and a longitudinal portion clamped by the clamping means extending from said rectangular section.

13. A shielding device assembly comprising:
a printed circuit board;
a metallic shielding shell made from sheet metal and including a top wall and four side walls to commonly define a receiving cavity, at least one clamping device formed on one corner of said four side walls; and
said clamping device including a first clamping part and a second clamping part offset from each other in a first horizontal direction along which the corresponding side wall extends, and further in a second horizontal direction perpendicular to said first horizontal direction with a gap therebetween; and
at least one bracket soldered upon the printed circuit board and corresponding to said clamping device; wherein
the shielding shell is adapted to be assembled upon the printed circuit board via said clamping device retained to the bracket, wherein the bracket is received in the corresponding gap and sandwiched between the first clamping part and the second clamping part in said second direction.

14. The shielding device assembly as claimed in claim 13, wherein another gap is formed between the first clamping part and the second clamping part in the first horizontal direction, and said bracket blocks said another gap in the second horizontal direction.

15. The shielding device assembly as claimed in claim 14, wherein the second clamping part is located on an outer position than the first clamping part in said second horizontal direction, and the second clamping part is located around the corner while the first clamping part is spaced from the corner in said first horizontal direction.

16. The shielding device assembly as claimed in claim 15, wherein said second clamping part forms at least one inward dome, said first clamping part forms at least one outward dome, and the bracket forms two holes respectively receiving said inward dome and said outward dome.

17. The shielding device assembly as claimed in claim 15, wherein said first clamping part forms an inward flaring edge while the second clamping part forms an outward flaring edge.

18. The shielding device assembly as claimed in claim 15, wherein said clamping device conforms with said corner and forms a right angle structure with two interference pieces each including said first clamping part and said second clamping part, and said bracket forms a similar right angle structure to comply with said clamping device.

19. The shielding device assembly as claimed in claim 18, wherein a slit is formed at the corner between the two second clamping parts of said interference pieces, and said bracket blocks said slit.

20. The shielding device assembly as claimed in claim 13, wherein said bracket forms a staggered structure on a bottom edge in a vertical direction.

* * * * *